United States Patent [19]

Coquin et al.

[11] 4,037,111
[45] July 19, 1977

[54] MASK STRUCTURES FOR X-RAY LITHOGRAPHY

[75] Inventors: Gerald Allan Coquin; Juan Ramon Maldonado, both of Berkeley Heights; Dan Maydan, Short Hills; Sasson Roger Somekh, Berkeley Heights, all of N.J.

[73] Assignee: Bell Telephone Laboratories, Incorporated, Murray Hill, N.J.

[21] Appl. No.: 693,939

[22] Filed: June 8, 1976

[51] Int. Cl.$^2$ .................. B01J 17/00; G02B 5/00; G21F 5/04
[52] U.S. Cl. ................................. 250/505; 29/579; 96/36.2; 250/514
[58] Field of Search ............... 250/505, 514; 96/36.2; 29/579

[56] References Cited

U.S. PATENT DOCUMENTS

| 3,892,973 | 7/1975 | Coquin et al. ..................... 250/505 |
| 3,925,677 | 12/1975 | Fraser ............................... 250/505 |
| 3,958,263 | 5/1976 | Panish et al. ....................... 357/18 |

OTHER PUBLICATIONS

"Spurious Effects Caused by the Continuous Radiation and Ejected Electrons in X-ray Lithography," *Jour. Vac. Sci. Technol.*, vol. 12, No. 6, Nov./Dec. 1975, Maldonado, pp. 1329-1331.

Primary Examiner—Alfred E. Smith
Assistant Examiner—T. N. Grigsby
Attorney, Agent, or Firm—Lucian C. Canepa

[57] ABSTRACT

It has been observed that the deposition and patterning of metallic layers on a supported X-ray-transparent film to form a mask for X-ray lithography introduce stresses in the mask structure. In turn these stresses cause distortions of the film and of the high-resolution X-ray-absorptive pattern formed thereon. Various techniques, including new metallization systems, are proposed for minimizing the establishment of stresses in such structures.

22 Claims, 3 Drawing Figures

MASK STRUCTURES FOR X-RAY LITHOGRAPHY

BACKGROUND OF THE INVENTION

This invention relates to the fabrication of microminiature devices and, more particularly, to mask structures for us in an X-ray lithographic system.

An advantageous mask structure for use in an X-ray lithographic system is disclosed in U.S. Pat. No. 3,892,973 issued to G. A. Coquin, J. R. Maldonado and D. Maydan. The structure disclosed there comprises a mask substrate made of a thin sheet of polyester film. The film is stretched over and bonded to a support member. The supported film constitutes a highly planar and durable substrate that is as dimensionally stable as the support member itself.

As disclosed in the aforecited patent, X-ray-absorptive elements definitive of a prescribed pattern are formed on the mask substrate. These elements may be made, for example, of a single layer of gold or platinum.

For some applications of practical interest, it has been demonstrated that it is advantageous to form the X-ray-absorptive elements of the mask from a trimetal system deposited on the substrate. One such system comprises a thin bottom layer of titanium utilized to enhance adhesion of a relatively thick layer of gold to the substrate. In addition, a layer of titanium on top of the gold serves as a masking layer during selective patterning of the gold.

Applicants have found that the top and bottom layers of a trimetal system of the type specified above are in practice typically deposited with stresses. In turn, these stresses have been observed to cause deleterious distortions of the substrate and of the high-resolution X-ray-absorptive pattern formed thereon. As a result of these distortions, X-ray mask structures of the type described were found to be unsatisfactory for some high-resolution applications, especially where each of a set of multiple masks had to be successively aligned with high precision with respect to a wafer.

SUMMARY OF THE INVENTION

Accordingly, an object of the present invention is to improve X-ray lithography.

More specifically, an object of this invention is to provide improved mask structures for use in an X-ray lithographic system.

Briefly, these and other objects of the present invention are realized in a specific illustrative embodiment thereof that comprises as a mask substrate a thin sheet of polyimide film. The film is stretched over and bonded to a dimensionally stable support member. Deposited on the film is a three-layer metallization system. The bottom-most layer is selected to be a mixture of two metals, for example titanium and tantalum, that exhibit tensile and compressive stresses, respectively. By appropriately choosing the constituents of the mixture, the stresses in the two metals can be made to compensate each other thereby to provide an essentially stress-free layer.

The middle layer of the specific illustrative metallization system comprises a relatively thick layer of deposited gold that exhibits relatively low stress. On top of the gold is a mixture of two metals also designed to provide an essentially stress-free layer.

In practice, exact compensation to achieve an ideal zero-stress condition in a multiple-level metallization system can never be realized. Accordingly, illustrative mask structures made in accordance with this invention embody still other techniques for minimizing stress-induced distortions in the X-ray-absorptive pattern. These include coating the back of the film substrate with an X-ray-transparent material to impart stiffness to the substrate. In addition, it is advantageous to design the X-ray-absorptive pattern such that its peripheral portion overlies the dimensionally stable support member and such that the pattern is uniformly distributed on the substrate.

BRIEF DESCRIPTION OF THE DRAWING

A complete understanding of the present invention and of the above and other objects, features and advantages thereof may be gained from a consideration of the following detailed description presented hereinbelow in connection with the accompanying drawing, in which.

DETAILED DESCRIPTION

Figure 1:
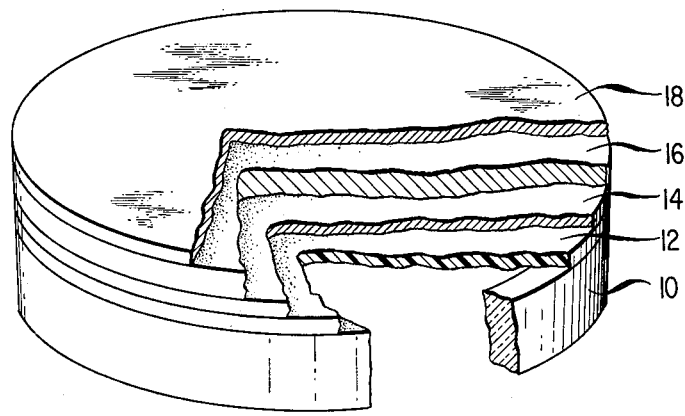
FIGS. 1 and 2 show specific illustrative unpatterned mask structures made in accordance with the principles of the present invention.

A stretched X-ray-transparent plastic film is utilized to form the substrate of a mask structure made in accordance with the principles of the present invention. Although a variety of materials are available and suitable for forming the substrate, applicants have found that it is advantageous to employ a polyimide film as the substrate material. One particularly advantageous material for this purpose is a thin sheet of Kapton polyimide film. (Kapton is a registered trademark of E. I. duPont de Nemours and Co.) Kapton film is commercially available in a variety of thicknesses. Such film exhibits an attractive combination of properties such as mechanical strength, low X-ray absorption, resistance to organic solvents, optical transparency, thermal stability, radiation resistance and good-quality surfaces.

Illustratively, the substrate of a particular X-ray mask structure that embodies the principles of this invention comprises a 0.001-inch-thick sheet of Kapton film. (Such a mask substrate will, for example, transmit about 70 percent of the X-rays, derived from an electron-bombarded palladium source, which are effective in exposing an X-ray-sensitive resist.) To prepare the substrate, a 5-inch by 5-inch piece of film is mounted in a conventional holding fixture. The fixture comprises, for example, a Teflon plastic ring over which the film is extended. (Teflon is a registered trademark of duPont.) In turn, the ring and film are squeeze fitted into a circular opening in a Teflon plate member. In that way, both sides of the film are accessible for a series of subsequent cleaning and coating steps.

As currently supplied by the manufacturer, one side of the Kapton film is typically smoother than the other. This smoother side, which will be referred to herein as the top side, is the one on which the X-ray-absorptive layers will subsequently be formed.

After being mounted in the holding fixture, the Kapton film is cleaned by being immersed in a mild basic solution (for example a solution of sodium hydroxide or sodium carbonate) for about 30 minutes. This serves to remove any trace of polyammic acid that remains on the film following its manufacture. Next, the mounted film is etched (in, for example, a dilute solution of tetraethyl ammonium hydroxide in dimethyl sulfoxide) to remove any particles embedded in the surfaces of the film. Then the film surfaces are further cleaned by immersing the film in a mild detergent solution which is ultrasonically agitated.

After the Kapton film member is rinsed and dried, an optically transparent organic material is adhered to the bottom or rougher side of the member. This is to improve the optical quality of the film so that it can be seen through easily and accurately by an operator using a microscope. Illustratively, a 2-micrometer ($\mu$m)-thick layer of Pyralin 4701 solution (made by duPont) spin coated on the bottom side of the film is effective to satisfactorily improve the optical quality of the film. Alternatively, other known materials such as epoxies or polymethyl methacrylate may be utilized to improve the optical quality of the film.

Another cleaning of the film in a mild basic solution, as specified above, followed by further ultrasonic agitation in a mild detergent solution may then be advantageous to assure extreme cleanliness of the film member.

The clean film member is then transferred from the aforedescribed holding fixture to a conventional stretching fixture. In this second-mentioned fixture, the film is mechanically stretched taut by elongating it by about 0.5%. While the film remains taut, a support member is bonded to the rougher side of the film by means of a suitable adhesive such as an epoxy cement. After the adhesive is cured, the supported film is removed from the stretching fixture and the excess film that overhangs the support member is trimmed by cutting.

Herein, the support member will be assumed to be formed in the shape of a ring. Although a ring shape has been found to be advantageous for a number of applications of practical interest, it is to be understood that the member may be formed in a variety of other geometrical shapes.

Advantageously, the ring-shaped support member is made of a strong, durable and dimensionally stable material. It has been found that a particularly attractive material out of which to make the support member is a borosilicate glass having a relatively low linear coefficient of expansion over a wide temperature range. One such material is Pyrex glass (Pyrex is a registered trademark of Corning Glass Works) which has a thermal expansion coefficient approximately equal to that of silicon. In addition, Pyrex glass is relatively inexpensive and easy to form in a variety of shapes.

A ring-shaped support member 10 having a plastic film 12 bonded thereto in accordance with the procedure specified above is shown in FIG. 1.

To cover defects such as scratches and to insure that the top surface of the film 12 of FIG. 1 is smooth and hard, it is advantageous in some cases to apply an X-ray-transparent coating thereto. For example, one or more 2-$\mu$m-thick layers of a polyimide precursor solution in n-methyl pyrilidene (such as Pyralin 4701) or of various epoxy systems or of a polyimide oligimer solution (such as solution No. 8020 made by the Upjohn Company) are useful for this purpose. (So as to not unduly clutter the drawing, these layers are not explicitly shown in FIG. 1. But it is to be understood that in some cases the film member 12 includes such layers thereon).

In accordance with one aspect of the principles of the present invention, a unique three-layer metallization system is deposited on the film substrate 12 of FIG. 1. The first such layer, designated by reference numeral 14, comprises a 50-Angstrom-units (A)-thick deposited mixture of tungsten and titanium.

Illustratively, the layer 14 of FIG. 1 is deposited on the plastic substrate 12 by sputtering, which is a well-known process. To achieve a mixed or composite tungsten-titanium layer by sputtering, the cathode target of the sputtering apparatus is selected to be a bimetal element. In one particular case in which a low-stress composite layer 14 was deposited on the film 12, 15 percent of the effective area of the cathode target was selected to be made of tungsten and 85 percent thereof was made of titanium. With such a target, a composite tungsten-titanium layer 14 about 50 A thick was sputter deposited on the substrate 12. In such a layer the compressive stresses in the tungsten constituent tended to nearly exactly compensate the tensile stresses in the titanium constituent. As a result, a very-low-stress deposited layer 14 was achieved.

Next, a layer 16 (FIG. 1) of gold about 7000 A thick was sputter deposited on top of the layer 14. It has been determined that in practice such a layer of gold is typically deposited with very low stresses. Subsequently, a 1000-A-thick composite layer 18 also made of a mixture of tungsten and titanium was sputter deposited on top of the gold layer 16. Illustratively, the layer 18 is formed by using in the sputtering apparatus a bimetal cathode target element of the same type specified above in connection with the depositing of the layer 14. Consequently, the deposited layer 18 also exhibited very low stresses.

Before describing the manner in which the layers 14, 16 and 18 of FIG. 1 are patterned to form a completed X-ray mask structure, a number of alternative ways in which to achieve a low-stress metallization system on the substrate 12 will be specified. Thus, for example, each of the layers 14 and 18 may be a sputter-deposited mixture of titanium and tantalum. By appropriate selection of the mixture, the tensile stresses introduced by the titanium constituent are almost exactly compensated by the compressive stresses introduced by the tantalum. In one particular embodiment, a low-stress structure was obtained by depositing each of the layers 14 and 18 in a sputtering apparatus having a cathode target half of whose effective area was made of titanium and half of tantalum.

Figure 2:
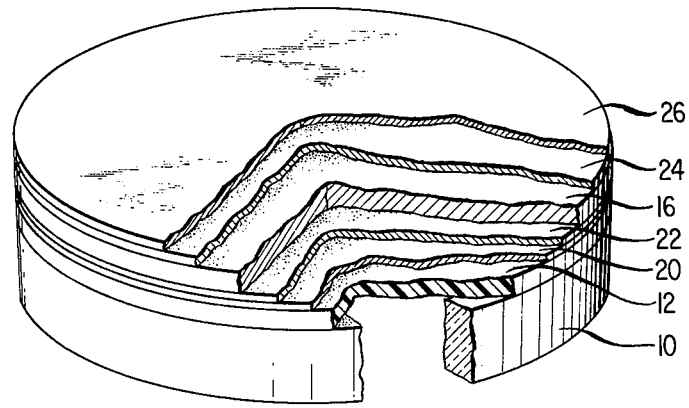

Alternatively, stress compensation in the layers below and above the layer 16 of FIG. 1 may be achieved by forming each of the layers 14 and 18 to include two separate and distinct thin films with respective stress compensating characteristics. Thus, for example, as shown in the structure of FIG. 2 which also comprises a ring-shaped support member 10 and a taut plastic substrate 12, two thin films 20 and 22 are deposited on top of each other on the supported substrate 12. Illustratively, the film 20 comprises a 50-A-thick sputtered layer of tungsten and the film 22 is a 150-A-thick sputtered layer of titanium. Or the film 20 may comprise a 75-A-thick sputtered layer of titanium and the film 22 a 150-A-thick sputtered layer of tantalum.

A layer 16 (FIG. 2) of, for example, gold is deposited on top of the film 22. In turn, two stress-compensating thin films 24 and 26 are deposited on top of each other on the layer 16. Illustratively, the film 24 comprises a 250-A-thick sputtered layer of tungsten and the film 26 is a 750-A-thick sputtered layer of titanium. Or the film 24 may comprise a 330-A-thick sputtered layer of titanium and the film 26 a 670-A-thick sputtered layer of tantalum.

At this point in the herein-described fabrication procedure, an unpatterned low-stress mask blank of the type represented in FIG. 1 or FIG. 2 has been produced. For purposes of a particular illustrative example, the FIG. 1 structure will be primarily emphasized hereinafter.

After removing the mask blank of FIG. 1 from the sputtering apparatus, a layer of resist material is spin coated on top of the layer 18 in a standard way. Advantageously, the resist material comprises a negative or positive electron-beam-sensitive resist of the type that can be selectively irradiated in a high-resolution way by an electron beam exposure system. Such a system is disclosed in U.S. Pat. No. 3,900,737 issued to R. J. Collier and D. R. Herriott. Various suitable electron-beam-sensitive resists are also described in the Collier-Herriott patent.

For illustrative purposes, it will be assumed that a 7000-A-thick film of glycidal methacrylate-co-ethyl acrylate (a known negative electron resist) is spin coated on the layer 18 of FIG. 1. Then by means, for example, of the system described in the Collier-Herriott patent, a high-resolution pattern is defined in the electronresist layer by selective irradiation of specified portions thereof. After the exposure step, the mask structure is removed from the electron beam system and the electronresist material is developed, that is, the unexposed resist material is removed from the layer 18.

Next, the aforedescribed mask structure is mounted in a conventional plasma etching unit. After establishing in the unit an oxygen plasma at a pressure of about 0.5 Torr at a power setting of about 100 watts, the structure is etched for approximately 2 minutes to remove any resist residue underlying non-irradiated regions. At that point a pattern corresponding exactly to the non-irradiated regions of the resist material is defined by uncovered surface portions of the composite layer 18.

Plasma etching of the uncovered portions of the composite layer 18 is carried out in, for example, a carbon tetrafluoride plasma at about 0.5 Torr and 100 watts. After about 10 minutes the entire thickness of the uncovered portions of the layer 18 is removed thereby to expose selected surface regions of the layer 16.

Advantageously, patterning of the selectively masked layer 16 is carried out in a conventional radio-frequency sputter etching chamber. Heat sinking of the mask structure during the etching process is advantageous to prevent distortions in the structure. Accordingly, the mask is, for example, mounted in the etching chamber in an aluminum fixture that includes a silver-impregnated foam pad in contact with the bottom side of the taut substrate 12.

Sputter etching in an atmosphere of argon and air for about one hour at a power setting of about 150 watts is effective to remove the unmasked portions of the layer 16. The mask structure is then removed from the sputtering apparatus for further processing.

To enhance the optical transmission characteristic of the mask structure, removal of those portions of the layer 14 (FIG. 1) directly underlying the etched-away regions of the layer 16 is then carried out. This is done, for example, with a mixture that comprises by volume 5 percent hydrofluoric acid, 5 percent nitric acid and 90 percent water. Etching for approximately 1 minute with such a solution is effective to remove the unmasked portions of the layer 14.

It is advantageous to coat the X-ray-absorptive pattern of a mask structure made in the manner specified above with a protective material such as Pyralin 4701, Upjohn's solution No. 8020, an epoxy resist, a photoresist or any of a variety of monomer and polymer plastic coatings. Such a material, which should be optically transparent and have a relatively low X-ray-absorption characteristic, serves to protect the X-ray-absorptive pattern from physical damage. Such a material also imparts additional rigidity to the mask structure and, in addition, prevents photoelectrons ejected from the X-ray-absorptive pattern by incident X-rays from contributing to exposure of an X-ray resist layer intended to be used in conjunction with the described mask structure.

Another advantageous material for forming the aforedescribed protective layer is Polymide P-91 made by duPont. In one specific illustrative mask structure made in accordance with the principles of the present invention, a 2-$\mu$m-thick layer of this material was spin coated on the X-ray-absorptive pattern and then cured at 100° C for 4 hours. In the cross-sectional representation of FIG. 3, this protective layer is designated by reference numeral 30.

In accordance with this invention, it has been found useful for some applications to apply still another coating 32 (FIG. 3) on top of the aforementioned protective layer 30. The coating 32, which comprises, for example, a spin-coated layer of polymethyl methacrylate about 1 $\mu$m thick, is intended to be periodically removed and replaced with a fresh coating. In that way any dirt captured by the coating 32 is also periodically removed whereby the cleanliness of the depicted mask structure may be maintained at a relatively high level.

Figure 3:
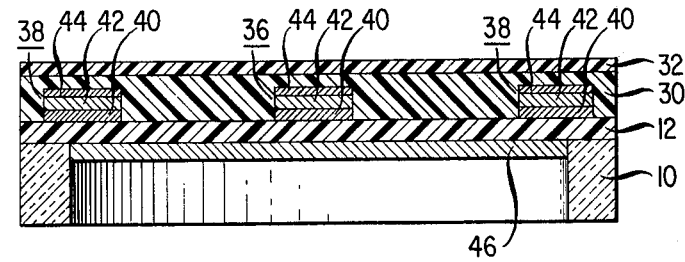
FIG. 3 is a cross-sectional representation of a patterned FIG. 1-type mask structure with the addition thereto of several layers that enhance the characteristics of the mask.

To correspond with the arrangement shown in FIG. 1, the depiction of FIG. 3 also includes a ring-shaped support member 10 and a plastic substrate 12 bonded to the member 10. In addition, a schematically over-simplified X-ray-absorptive pattern formed from the low-stress three-level-metallization system described above in connection with FIG. 1 is shown in FIG. 3. A portion 36 of an element of the X-ray-absorptive pattern is indicated in FIG. 3. Illustratively, this portion comprises a tungsten-titanium layer 40, a gold layer 42 and a tungsten-titanium layer 44. In addition, a portion 38 of a peripheral region of the patterned metallization system is also shown in FIG. 3. The portion 38 also comprises, for example, a tungsten-titanium layer 40, a gold layer 42 and a tungsten-titanium layer 44. The reason for including such a peripheral region in the depicted pattern will be set forth later below.

As described earlier above, a deposited X-ray-abosrptive pattern such as the one represented in FIG. 3 is characterized by very low stresses. In accordance with a further aspect of the principles of the present invention, the distortion that results from even such low stresses may be reduced by coating the underside of the substrate 12 of FIG. 3, with a layer of a relatively stiff X-ray-transparent material. Such a layer, designated 46 in FIG. 3, increases the overall stiffness of the mask structure. It has been found that a 2-$\mu$m-thick layer 46 of beryllium deposited on the bottom of the plastic substrate 12 is particularly effective to achieve stiffening of the depicted X-ray mask. Alternatively, a 10-$\mu$m-thick coating of silicon nitride may be utilized for the same purpose.

In accordance with another aspect of the principles of the present invention, the layout of the X-ray-absorptive pattern disposed on the substrate 12 is advantageously designed to further reduce distortion arising from any stresses in the deposited pattern. More specifically, peripheral portions of the pattern are formed on the substrate 12 to overlie at least some part of the supporting member 10. As a consequence, any forces that arise from stresses in the peripheral portions of the deposited pattern will be exerted on those parts of the substrate 12 that are bonded to the relatively immovable supporting member 10. Accordingly, very little if any movement of the substrate 12 results from the establishment of such peripheral forces. Hence, as a practical matter, very little if any distortion of the deposited pattern is caused by forces existing at peripheral discontinuities in the pattern.

In FIG. 3, a peripheral portion 38 of the deposited X-ray-absorptive pattern is shown overlying the dimensionally stable supporting member 10. This portion 38 may comprise a continuous outer region or a discontinuous segmented region that is evenly distributed around the perimeter of the mask structure in an overlying relationship with respect to the member 10. In either case any forces that are exerted by the portion 38 on the substrate 12 are not effective to cause any movement of the substrate and of the X-ray-absorptive pattern carried thereon.

Normally in fabricating a mask structure, one would not form a peripheral region such as the portion 38 shown in FIG. 3. The portion 38, at least that part thereof that overlies the member 10, is not a part of the pattern that is effective for defining features in an associated resist-coated wafer. Accordingly, especially where an expensive material such as gold is used in the metallization system on the substrate 12, one would ordinarily think expressly in terms of not including such peripheral portions in the completed mask structure.

Moreover, in accordance with the principles of the present invention, the effective portion of the X-ray-absorptive pattern exemplified by the element 36 of FIG. 3 is positioned on the substrate 12 within the ring defined by the number 10 in a uniformly distributed way. The discrete elements of such a pattern define discontinuites in the metallization system. Forces are exerted on the substrate 12 at those discontinuities. But if the elements are uniformly distributed over the area of the substrate, the forces exerted on the substrate will be uniformly distributed also and, as a result, no movement of the substrate will occur.

Finally, it is to be understood that the various above-described arrangements are only illustrative of the application of the principles of the present invention. In accordance with these principles, numerous other arrangements may be devised by those skilled in the art without departing from the spirit and scope of the invention. For example, although primary emphasis herein has been directed to the use of gold as the central element of the X-ray-absorptive pattern, it has been found in practice that other metals such as tantalum or tungsten are suitable absorbers provided a thickness of about 1 $\mu$m is used rather than the 0.7-$\mu$m thickness utilized for gold or platinum. Of course the requirement of a thicker film entails some loss of resolution capability. But the use of a single layer of tantalum or tungsten as the X-ray absorber offers significant advantages. Both materials are less expensive to deposit than gold or platinum and they are easily patterned in a well-resolved way in one step by, for example, etching in a freon plasma. Thus, when the minimum feature size on the mask allows a somewhat thicker absorbing layer, the use of tantalum or tungsten results in a considerable reduction in the cost of the mask. To fabricate such a layer that is stress-free, in accordance with the teachings of the present invention, it is advantageous in some cases of practical interest to form such a single layer of a stress-compensating mixture of tantalum and tungsten or a mixture of tantalum tungsten and titanium.

An additional cause of pattern distortion in X-ray mask structures has been identified. If the X-ray mask comprises isolated regions of metallization forming the X-ray-absorptive pattern, separated by areas that are electrically insulated, then the mask will typically acquire charges during exposure due to the ejection of photoelectrons from the metallization by incident X-rays. These charges exert in-plane electrostatic forces on the mask substrate and in some cases cause significant distortions in the pattern dimensions. The equilibrium charge acquired by the mask will depend on such factors as room humidity. Hence the amount of distortion might vary from day to day.

In accordance with another aspect of the principles of the present invention, a remedy for this unacceptable situation is to ensure that the completed mask has a bottom or top layer that is sufficiently conductive to equalize the charge continuously generated by the incident X-rays. In this way, only small highly localized dipoles are generated by the X-rays, and these exert negligible forces on the mask substrate. The requirements for this conductive layer are that it be highly transparent to both X-rays and visible radiation. It may, for example, be required only that the aforementioned thin layer adhered directly to the mask substrate be left as a part of the completed mask. Or, if it is desirable to remove this layer to improve optical transmission through the mask re-registration purposes, then the removal (etching) should be confined to a small area on the mask in the vicinity of any fiducial marks thereon. If it is found to be more convenient to remove the thin layer completely, then the mask can be recoated with an optically and X-ray-transparent layer such as 200 A to 400 A of evaporated carbon. Alternatively, a conductive organic material can be used for the protective layer 30 (FIG. 3).

What is claimed is:

1. A mask structure for X-ray lithography comprising a dimensionally stable support member, an X-ray-transparent film stretched over and bonded to said support member, and means including stress-compensating constituents for forming a very-low-stress X-ray-absorptive pattern on said substrate.

2. A structure as in claim 1 wherein said forming means comprises
   a relatively thin patterned layer on said substrate, said layer comprising a mixture of metals characterized by respectively compensating stresses,
   a relatively thick correspondingly patterned X-ray-absorbent layer on said relatively thin layer,
   and another relatively thin correspondingly patterned layer on said relatively thick layer, said second-mentioned relatively thin layer also comprising a mixture of metals characterized by respectively compensating stresses.

3. A structure as in claim 2 wherein the metals included in each of said relatively thin layers comprise a mixture of tungsten and titanium.

4. A structure as in claim 2 wherein the metals included in each of said relatively thin layers comprise a mixture of tantalum and titanium.

5. A structure as in claim 1 wherein said forming means comprises two relatively thin patterned layers deposited on top of each other on said substrate, wherein said layers are metallic and are characterized by respectively compensating stresses, a relatively thick correspondingly patterned X-ray-absorbent layer deposited on top of the upper one of said two relatively thin patterned layers, and two additional relatively thin correspondingly patterned layers deposited on top of each other on said relatively thick layer, wherein said two additional layers are also metallic and also characterized by respectively compensating stresses.

6. A structure as in claim 5 wherein the two relatively thin layers below and above said relatively thick layer each are made of tungsten and titanium, respectively.

7. A structure as in claim 6 wherein the two relatively thin layers below and above said relatively thick layer each are made of tantalum and titanium, respectively.

8. A structure as in claim 1 further including an X-ray-transparent layer deposited on said pattern on one side of said film to protect the pattern from physical damage and to stop photoelectrons emitted from the pattern.

9. A structure as in claim 8 further including an additional X-ray-transparent layer deposited on top of said first-mentioned layer for capturing dirt particles, said additional layer being adapted to be periodically and easily removed from said structure to maintain the surface cleanliness of the structure.

10. A structure as in claim 9 further including an X-ray-transparent coating deposited on the other side of said film for increasing the stiffness of said film.

11. A structure as in claim 10 wherein said coating comprises a 2-μm-thick layer of beryllium.

12. A structure as in claim 10 wherein said coating comprises a 10-μm-thick layer of silicon nitride.

13. A structure as in claim 10 wherein said support member is formed in the shape of a ring.

14. A structure as in claim 13 wherein said ring-shaped support member is made of a borosilicate glass.

15. A structure as in claim 14 wherein said film is a polyimide film.

16. A mask structure for X-ray lithography comprising a dimensionally stable support member, an X-ray-transparent film stretched over and bonded to said support member, and an essentially stress-free X-ray-absorptive pattern disposed on said film in a uniformly distributed way, the peripheral portion of said pattern overlying said support member.

17. A structure as in claim 16 wherein said pattern comprises
elements made of a relatively thick X-ray-absorptive material,
first stress-compensated means adhering said elements to said film,
and second stress-compensated means on top of said elements.

18. A structure as in claim 17 wherein each of said first and second stress-compensated means is made of a mixture of tungsten and titanium.

19. A structure as in claim 17 wherein each of said first and second stress-compensated means is made of a mixture of tantalum and titanium.

20. A structure as in claim 17 wherein each of said first and second stress-compensated means comprises two thin films, one made of tungsten and the other of titanium.

21. A structure as in claim 17 wherein each of said first and second stress-compensated means comprises two thin films, one made of tantalum and the other of titanium.

22. A mask structure for X-ray lithography comprising a dimensionally stable support member, an X-ray-transparent film stretched over and bonded to said support member, means including stress-compensating constituents for forming a very-low-stress X-ray-absorptive pattern on said substrate, and conductive means in contact with said film for equalizing charges acquired by said mask structure due to the ejection of photo-electrons from said forming means during irradiation of said structure by X-rays.

* * * * *